United States Patent
Brees et al.

(10) Patent No.: US 12,492,469 B2
(45) Date of Patent: Dec. 9, 2025

(54) SUBLIMATION CONTROL USING DOWNSTREAM PRESSURE SENSING

(71) Applicant: LAM RESEARCH CORPORATION, Fremont, CA (US)

(72) Inventors: Marvin Clayton Brees, Boulder Creek, CA (US); Davinder Sharma, San Jose, CA (US); Panya Wongsenakhum, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 11 days.

(21) Appl. No.: 18/035,456

(22) PCT Filed: Nov. 17, 2021

(86) PCT No.: PCT/US2021/059681
§ 371 (c)(1),
(2) Date: May 4, 2023

(87) PCT Pub. No.: WO2022/109003
PCT Pub. Date: May 27, 2022

(65) Prior Publication Data
US 2023/0399741 A1    Dec. 14, 2023

Related U.S. Application Data

(60) Provisional application No. 63/116,041, filed on Nov. 19, 2020.

(51) Int. Cl.
C23C 16/448    (2006.01)
C23C 14/54    (2006.01)
(Continued)

(52) U.S. Cl.
CPC .......... *C23C 16/448* (2013.01); *C23C 14/542* (2013.01); *C23C 16/4485* (2013.01);
(Continued)

(58) Field of Classification Search
CPC . C23C 16/448; C23C 14/542; C23C 16/4485; C23C 16/45557; C23C 16/52; H01L 21/67109; H01L 21/67248
See application file for complete search history.

(56) References Cited

U.S. PATENT DOCUMENTS 4,276,243 A    6/1981  Partus
6,296,711 B1 *    10/2001  Loan ................ C23C 16/45561
392/399

(Continued)

FOREIGN PATENT DOCUMENTS

CN    102834164 A  *  12/2012  ......... B01D 53/9495
EP    0040540 A2    11/1981
(Continued)

OTHER PUBLICATIONS

JJ Di Steffano et al, Feedback and control systems online series, McGraw-Hill (Year: 1967).*

(Continued)

*Primary Examiner* — Jeffrie R Lund

(57) ABSTRACT

A system to control gas flow includes an ampoule to store a solid precursor. A heater is to heat the ampoule and to sublimate the solid precursor into a gaseous precursor. A mass flow controller is to regulate a flow of gaseous precursor from the ampoule to a substrate processing chamber. A pressure sensor is to measure a pressure of the gaseous precursor input to the mass flow controller. A controller is to apply power to the electric heater using closed loop control based on the pressure and a pressure setpoint.

20 Claims, 9 Drawing Sheets

(51) Int. Cl.
*C23C 16/455* (2006.01)
*C23C 16/52* (2006.01)
*H01L 21/67* (2006.01)

(52) U.S. Cl.
CPC ........ *C23C 16/45557* (2013.01); *C23C 16/52* (2013.01); *H01L 21/67109* (2013.01); *H01L 21/67248* (2013.01)

(56) References Cited

U.S. PATENT DOCUMENTS

| | | | | |
|---|---|---|---|---|
| 6,701,066 | B2* | 3/2004 | Sandhu | ............... C23C 16/4485 |
| | | | | 392/386 |
| 9,951,423 | B2* | 4/2018 | Lenz | ................. C23C 16/45561 |
| 2003/0072875 | A1* | 4/2003 | Sandhu | ............... C23C 16/4486 |
| | | | | 118/692 |
| 2006/0173642 | A1* | 8/2006 | Shajii | .................... G01F 15/024 |
| | | | | 702/100 |
| 2013/0183444 | A1* | 7/2013 | Soininen | ........... C23C 16/45544 |
| | | | | 427/248.1 |
| 2016/0097127 | A1* | 4/2016 | Lenz | ...................... C23C 16/52 |
| | | | | 137/12 |
| 2018/0265983 | A1* | 9/2018 | Qian | ................. C23C 16/45561 |
| 2019/0206707 | A1 | 7/2019 | Brashear et al. | |
| 2019/0391602 | A1 | 12/2019 | Xu et al. | |
| 2022/0042174 | A1* | 2/2022 | Woelk | ..................... C23C 16/52 |
| 2023/0399741 | A1* | 12/2023 | Brees | .................... C23C 14/542 |

FOREIGN PATENT DOCUMENTS

| | | | | |
|---|---|---|---|---|
| JP | | 2020123728 A | 8/2020 | |
| WO | WO-2021067764 A1 | * | 4/2021 | ......... C23C 16/4481 |

OTHER PUBLICATIONS

Mayr, Otto, The Origins of Feedback Control, The Colonial Press (Year: 1970).*
Mayr, Otto, The Origins of Feedback Control (Year: 1969).*
International Search Report and Written Opinion of the ISA issued in PCT/US2021/059681, mailed Mar. 8, 2022; ISA/KR.

* cited by examiner

SUBLIMATION CONTROL USING DOWNSTREAM PRESSURE SENSING

CROSS-REFERENCE TO RELATED APPLICATIONS

This application is a U.S. National Phase Application under 35 U.S.C. 371 of International Application No. PCT/US2021/059681, filed on Nov. 17, 2021, which claims the benefit of U.S. Provisional Application No. 63/116,041, filed on Nov. 19, 2020. The entire disclosures of the above applications are incorporated herein by reference.

FIELD

The present disclosure relates to systems and methods for controlling process gas flow to a processing chamber and more particularly to systems and methods for controlling ampoule heating based on a pressure of sublimating gas measured downstream of the ampoule.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems can be used to treat substrates, such as semiconductor wafers. Example processes that can be performed on a substrate include, but are not limited to, deposition, etching, and cleaning.

A substrate can be arranged on a substrate support, such as a pedestal or an electrostatic chuck (ESC), in a processing chamber. During processing, gas mixtures can be introduced into the processing chamber and plasma can be used to initiate chemical reactions.

A controller of a substrate processing system can be configured to control gas flow to and from the processing chamber. The controller can also be configured to control power applied to one or more electrodes in the processing chamber, such as to strike plasma. The controller can control power applied to one or more electrodes based on one or more voltage and/or current measurements.

SUMMARY

In a feature, a system to control gas flow is described. An ampoule is to store a solid precursor material. A heater is to heat the ampoule and to sublimate the solid precursor material into a gaseous precursor. A mass flow controller is to regulate a flow of the gaseous precursor from the ampoule to a processing chamber. A pressure sensor is to measure a pressure of the gaseous precursor input to the mass flow controller. A controller is to apply power to the heater using closed loop control based on the pressure and a pressure setpoint.

In further features, the controller is to increase power to the heater when the pressure is less than the pressure setpoint and to decrease power to the heater when the pressure is greater than the pressure setpoint.

In further features, the solid precursor material is one of molybdenum and tungsten.

In further features, the controller is to vary a duty cycle of power applied to the heater based on the pressure and the pressure setpoint.

In further features, the controller is to vary at least one of (a) and (b) based on the pressure and the pressure setpoint, where (a) comprises a voltage applied to the heater and (b) comprises a current through the heater.

In further features, the closed loop control comprises proportional integral control.

In further features, the controller is to determine an adjustment based on a difference between the pressure and the pressure setpoint and to selectively adjust the power applied to the heater based on the adjustment.

In further features, a temperature sensor is to measure a temperature of the ampoule, where the controller is to apply power to the heater further based on the temperature of the ampoule and a temperature setpoint.

In further features, the controller is to: determine a first adjustment based on a first difference between the pressure and the pressure setpoint; selectively adjust the temperature setpoint based on the first adjustment; determine a second adjustment based on a second difference between the temperature of the ampoule and the temperature setpoint; and selectively adjust the power applied to the heater based on the second adjustment.

In further features, the controller is to: determine a first duty cycle based on a first difference between the temperature of the ampoule and the temperature setpoint; determine an adjustment based on a second difference between the pressure and the pressure setpoint; determine a second duty cycle based on the first duty cycle and the adjustment; and apply power to the heater at the second duty cycle.

In further features, the controller is to disable the closed loop control when the pressure is one of: less than a first predetermined pressure and greater than a second predetermined pressure that is greater than the first predetermined pressure.

In further features, the controller is to generate an alert when the pressure is less than a predetermined pressure.

In further features, the controller is to generate an alert when a temperature of the ampoule measured by a temperature sensor is greater than or equal to a predetermined temperature.

In further features, the pressure sensor is disposed between the ampoule and the mass flow controller.

In further features, the mass flow controller comprises the pressure sensor.

In a feature, a method of controlling gas flow includes: storing a solid precursor material in an ampoule; heating the ampoule and sublimating the solid precursor material into a gaseous precursor; by a mass flow controller, regulating a flow of the gaseous precursor from the ampoule to a substrate processing chamber; by a pressure sensor, measuring a pressure of the gaseous precursor input to the mass flow controller; and applying power to the heater using closed loop control based on the pressure and a pressure setpoint.

In further features, the applying power includes increasing power to the heater when the pressure is less than the pressure setpoint and decreasing power to the heater when the pressure is greater than the pressure setpoint.

In further features, the applying power includes varying a duty cycle of power applied to the heater based on the pressure and the pressure setpoint.

In further features, the applying power includes, based on the pressure and the pressure setpoint, varying at least one of (a) a voltage applied to the heater and (b) a current through the heater.

In a feature, a system to control gas flow includes: an ampoule to store a solid precursor material; a heater to heat the ampoule and to sublimate the solid precursor material into a gaseous precursor; and a controller to apply power to the heater using closed loop control based on (a) a pressure of the gaseous precursor between the ampoule and a mass flow controller and (b) a pressure setpoint.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Some materials can be sublimated from solid to gas. An ampoule is a sealed container and can contain a solid sublimating material. The solid sublimating material can be a solid precursor material, such as for deposition of a film on a substrate. For example, the solid sublimating material can be tungsten or molybdenum. A heater can warm the ampoule to cause the solid precursor material to transition to gas. For example, the heater can be an electric heater. A mass flow controller (MFC) can then regulate flow of the gas from the ampoule to a processing chamber (e.g., for deposition of a film on a substrate).

A controller could be provided to apply power to the heater based on a temperature of the ampoule. For example, the controller could apply power to the heater based on the temperature and a setpoint temperature. In embodiments, if the pressure of the gas input to the MFC becomes less than a predetermined pressure, processing of the substrate can be insufficient and the substrate can be discarded and scrapped. Stability of the pressure of the gas input to the MFC can be important to achieving target substrate processing. For example, stability of the pressure of the gas can be important to achieving film deposition uniformity.

The present application involves measuring a pressure of the gaseous precursor between the ampoule and the MFC using a pressure sensor. For example, the controller can control heating of the ampoule (and therefore the solid sublimating material) based on the pressure measured by the pressure sensor and a setpoint pressure using closed loop control. One example of closed loop control is proportional integral (PI) control. Closed loop control based on the pressure measured between the ampoule and the MFC can maximize stability of pressure of gas input to the MFC for substrate processing.

Figure 1:
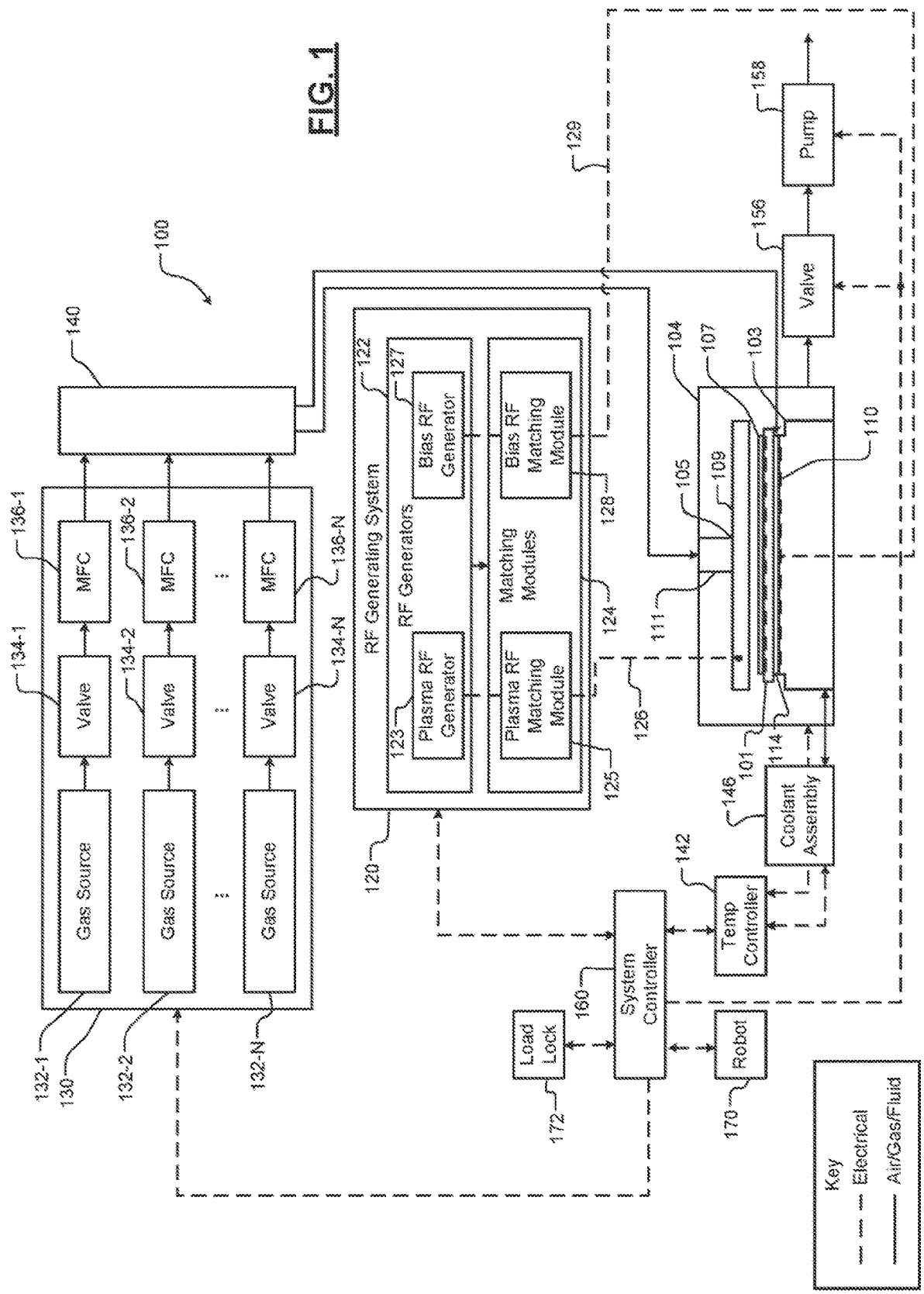
FIG. 1 includes a functional block diagram of an example substrate processing system including an electrostatic chuck (ESC)

FIG. 1 includes a functional block diagram of an example substrate processing system 100. The substrate processing system 100 can include an electrostatic chuck (ESC) 101. Although FIG. 1 shows a capacitive coupled plasma (CCP) system, the present application is also applicable to inductively coupled plasma systems and other types of processing systems, thermal systems, and plasma processing systems. The ESC 101 can electrostatically clamp substrates to the ESC 101 for processing. In various implementations, the ESC 101 can be omitted, and another substrate support can be used.

The substrate processing system 100 includes a processing chamber 104. The ESC 101 is enclosed within the processing chamber 104. The processing chamber 104 also encloses other components and contains radio frequency (RF) plasma. For example, the processing chamber 104 can enclose an upper electrode 105. During operation, a substrate 107 (e.g., a semiconductor wafer) is arranged on the ESC 100. The substrate 101 can be electrostatically clamped to the ESC 101.

A showerhead 109 can introduce and distribute gases. The showerhead 109 can include or serve as the upper electrode 105. The showerhead 109 can include a stem portion 111. The stem portion 111 can include one end connected to a top surface of the processing chamber 104. The showerhead 109 can be generally cylindrical. The showerhead 108 can extend radially outward from an opposite end of the stem portion 111 at a location that is spaced from the top surface of the processing chamber 104. A substrate-facing surface of the showerhead 109 can include holes through which gas flows for processing. Alternately, the upper electrode 105 can include a conducting plate. In such an example, the gases can be introduced in another manner.

A baseplate 103 can include a lower (bias) electrode 110. One or both of the ESC 101 and the baseplate 103 can include temperature control elements (TCEs). An intermediate layer 114 can be arranged between the ESC 101 and the baseplate 103. The intermediate layer 114 can bond or otherwise adhere the ESC 101 to the baseplate 103. As an example, the intermediate layer 114 can be formed of an adhesive material suitable for bonding the ESC 101 to the baseplate 103.

The baseplate 103 can include one or more gas channels and/or one or more coolant channels. The gas channels can flow backside gas to a backside of the substrate 107. The coolant channels flow coolant through the baseplate 103.

An RF generating system 120 generates and outputs RF voltages to the upper electrode 105 and the lower electrode 110. One of the upper electrode 105 and the lower electrode 110 can be DC grounded, AC grounded, or at a floating potential. For example only, the RF generating system 120 can include one or more RF generators 122 that generate RF voltages. The output of the RF generator(s) 122 are fed by one or more matching modules 124 to the upper electrode 105 and/or the lower electrode 110. The matching modules 124 are configured to match their impedances to the impedances of the upper and lower electrodes 105 and 110. The matching modules 124 can match impedances to minimize reflection.

As an example, a plasma RF generator 123 can generate power to be applied to the upper electrode 105. A plasma RF matching module 125 can impedance match the power from the plasma RF generator 123 to the impedance of the upper electrode 105. The plasma RF matching module 125 can apply the (impedance matched) power to the upper electrode 105 via a first transmission line 126. A bias RF generator 127 can generate power to be applied to the lower electrode 110.

A bias RF matching module 128 can impedance matches the power from the bias RF generator 127 to the impedance of the lower electrode 110. The bias RF matching module 128 can apply the (impedance matched) power to the lower electrode 110 via a second transmission line 129. While the example provided includes an RF system, the present application is also applicable to non-RF systems.

A gas delivery system 130 can include one or more gas sources 132-1, 132-2, . . . , and 132-N (collectively gas sources 132). N is an integer greater than zero. The gas sources 132 can supply one or more precursors and gas mixtures thereof. The gas sources 132 can also supply etch gas, carrier gas, and/or purge gas. Vaporized precursor can also be used.

The one or more gas sources 132 can be connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 can be fed to the processing chamber 104. For example only, the output of the manifold 140 can be fed to the showerhead 109. In various implementations, the valves 134 can be omitted.

The substrate processing system 100 can include a cooling system. The cooling system can include a temperature controller 142. Although shown separately from a system controller 160, the temperature controller 142 can be implemented as part of the system controller 160. The baseplate 103 can include a plurality of temperature controlled zones (e.g., 4 zones). Each of the temperature controlled zones can include one or more temperature sensors and one or more temperature control elements (TCEs). The temperature controller 142 can control operation of the TCEs of a zone based on the temperature(s) measured by the temperature sensor(s) of that zone.

The temperature controller 142 can also control a flow rate of backside gas to the gas channels from one or more of the gas sources 132. The temperature controller 142 can also control a temperature and a flowrate of coolant flowing through the coolant channels via a coolant assembly 146. The coolant assembly 146 can include a coolant pump that pumps coolant from a reservoir to the coolant channels. The coolant assembly 146 can also include a heat exchanger that transfers heat away from the coolant, such as to air. The coolant can be, for example, a liquid coolant.

A valve 156 and pump 158 can be used to evacuate reactants from the processing chamber 104. A robot 170 can deliver substrates onto and remove substrates from the ESC 101. For example, the robot 170 can transfer substrates between the ESC 101 and a load lock 172. The system controller 160 can control operation of the robot 170. The system controller 160 can also control operation of the load lock 172.

Figure 2:
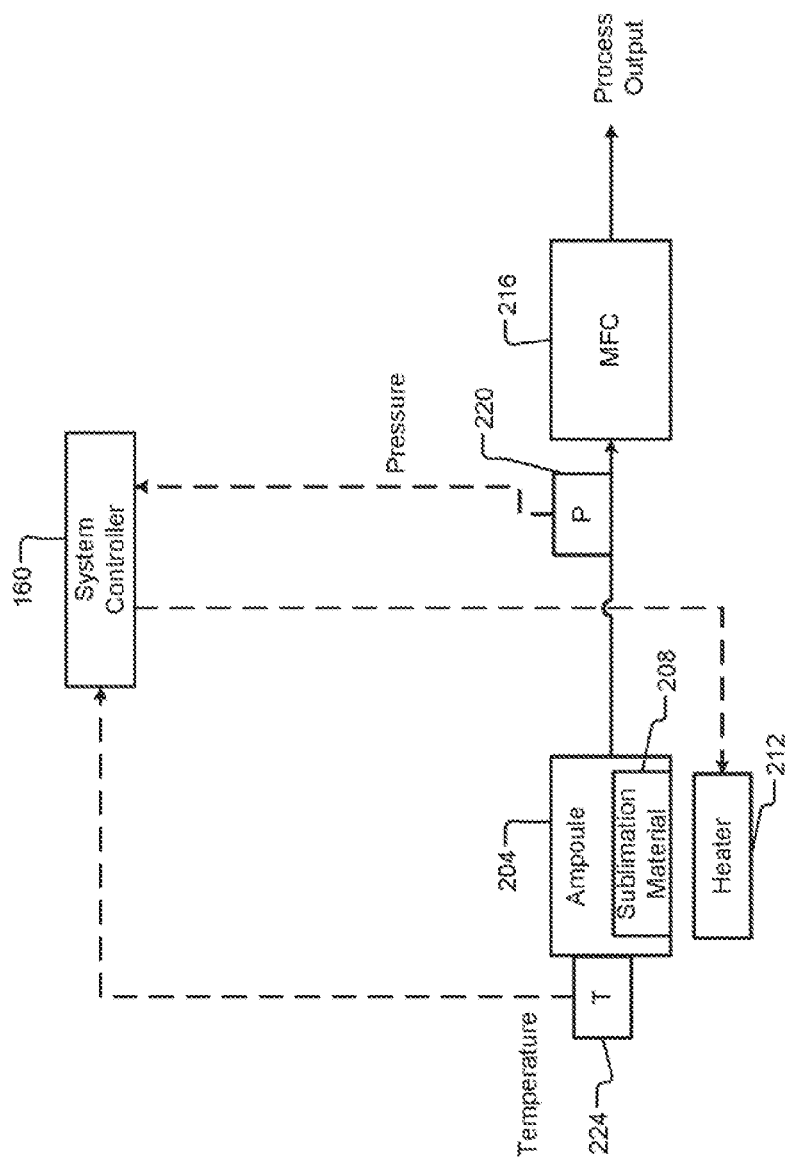
FIGS. 2 and 3 are functional block diagrams of an example gas delivery system.

FIG. 2 includes a functional block diagram of an example gas delivery system. One type of gas source can be an ampoule 204. The ampoule 204 can include a solid precursor material 208. The solid precursor material 208 can be, for example, molybdenum, tungsten, or another suitable type of solid material that can be sublimated into a gas. The ampoule 204 can also be referred to as a canister.

A heater 212 heats the ampoule 204, such as to control sublimation of the solid precursor material 208. The heater 212 can include a resistive heater or another suitable type of electric heater. The heater 212 can encircle the ampoule 204. The heater 212 can also be disposed below a bottom of the ampoule 204. While the example of an electric heater is provided, another type of heater can be used.

Gas from the solid precursor material 208 (gaseous precursor) flows from the ampoule 204 to a mass flow controller (MFC) 216. The MFC 216 regulates flow of the gaseous precursor to the processing chamber 104. In various implementations, a valve can be disposed between the ampoule 204 and the MFC 216 and actuated to control flow of the gaseous precursor from the ampoule 204.

A pressure sensor 220 measures a pressure of the gaseous precursor downstream of the ampoule 204, such as between the ampoule 204 and the MFC 216. The pressure sensor 220 can measure pressure of the gaseous precursor at a location less than a predetermined distance from the MFC 216. The pressure sensor 220 being less than the predetermined distance from the MFC 216 can increase accuracy of control of the gaseous precursor to the processing chamber 104 from the ampoule 204. The predetermined distance can be, for example, approximately 12 inches (approximately 30.48 centimeters) or another suitable distance. Approximately can mean+/−10 percent in various implementations.

Figure 3:
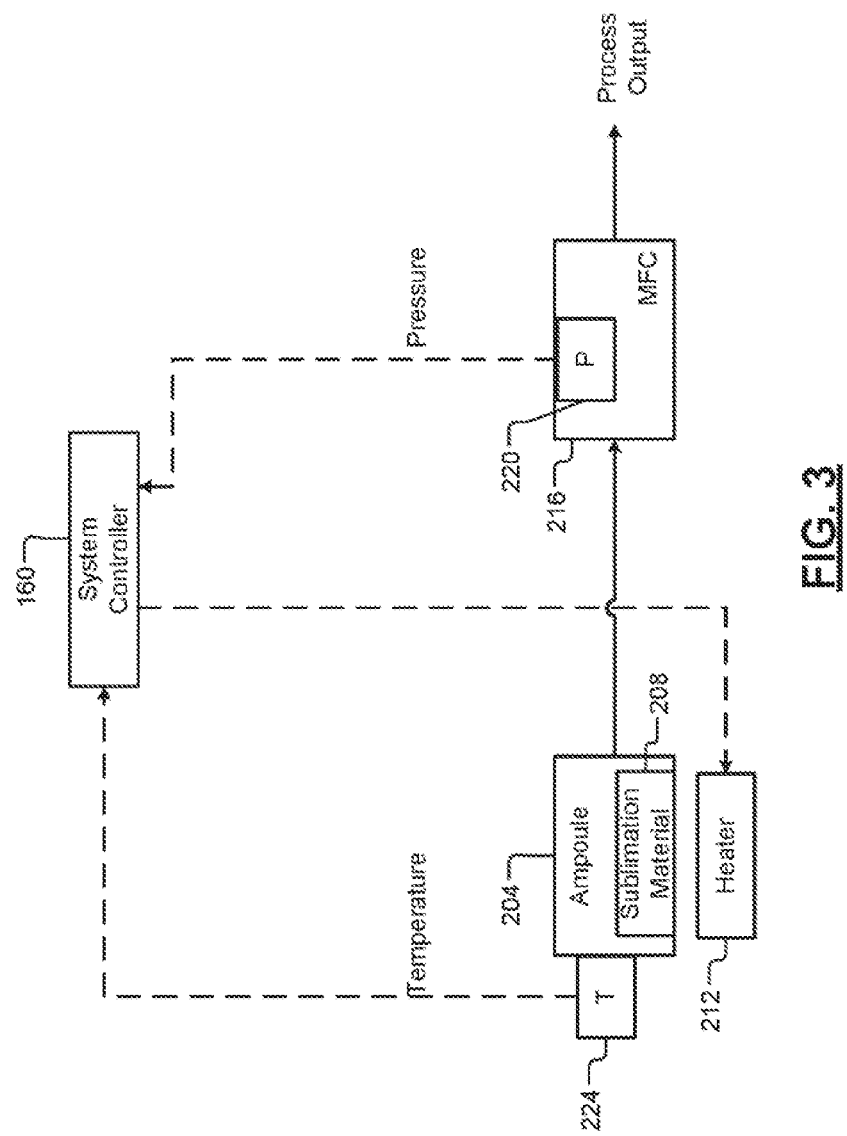

As shown in the example of FIG. 3, the pressure sensor 220 can be implemented within the MFC 216 and measure the pressure of gaseous precursor input to the MFC 216.

A temperature sensor 224 measures a temperature, such as a temperature of the ampoule 204 or a temperature of the heater 212. The system controller 160 controls the application of power to the heater 212 based on the pressure measured by the pressure sensor 220 as discussed further below. The system controller 160 can control the application of power to the heater 212 further based on the temperature measured by the temperature sensor 224.

Figure 4:
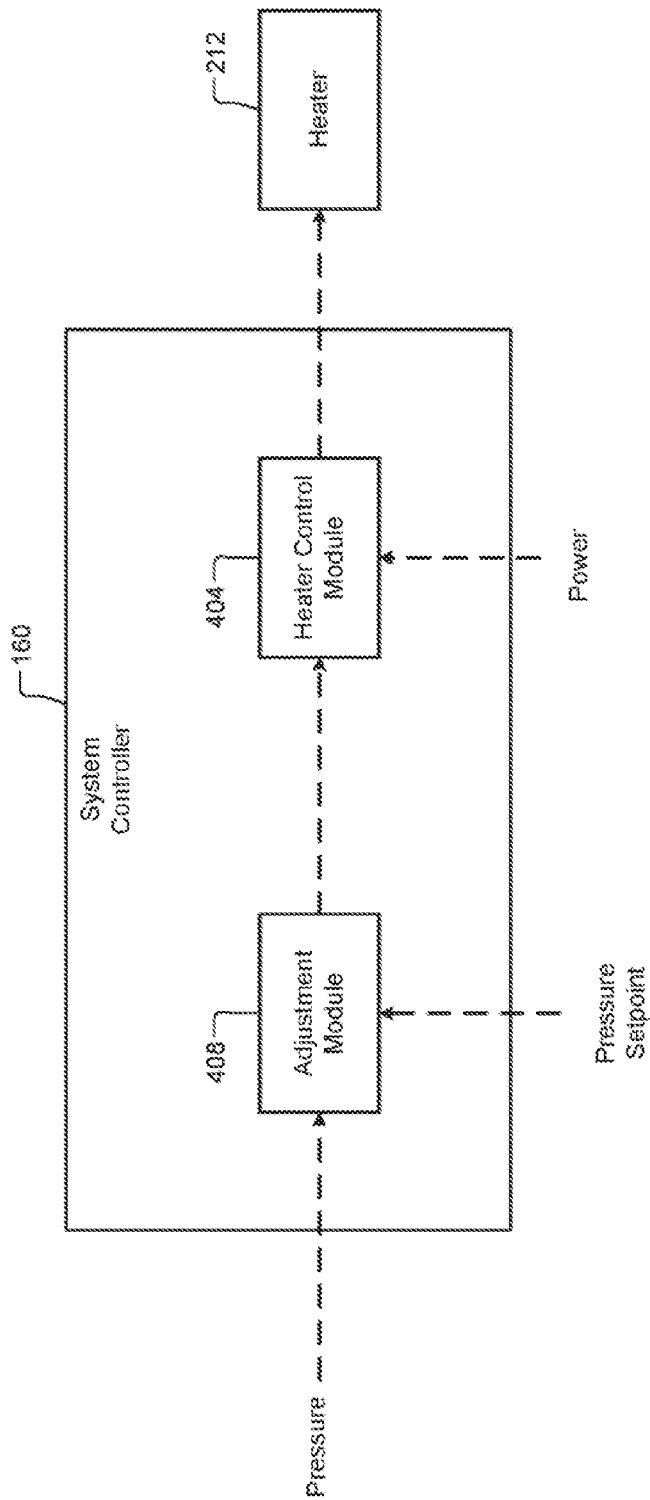
FIGS. 4-8 are functional block diagrams of example system controllers.

FIG. 4 is a functional block diagram of an example implementation of the system controller 160. A heater control module 404 receives power, such as direct current (DC) power from a power source. The heater control module 404 controls application of power to the heater 212. For example, the heater control module 404 can control a duty cycle of power applied to the heater 212. The duty cycle can refer to a period of that power that is applied during each predetermined period. Power cannot be applied for the remainder of each predetermined period.

While the example of PWM control is provided, the present application is also applicable to other types of control. For example, the heater control module 404 can control at least one of (a) a voltage applied to the heater 212 and (b) current through the heater 212.

The heater control module 404 selectively adjusts (increases or decreases) power applied to the heater 212 based on a heater adjustment from an adjustment module 408. The heater control module 404 can, for example, based on the heater adjustment adjust the duty cycle, the voltage applied to the heater 212, and the current through the heater 212. For example, the heater control module 404 can increase at least one of the duty cycle (relative to a present duty cycle), the voltage (relative to a present voltage), and the current (relative to a present current) as the heater adjustment increases. The heater control module 404 can decrease at least one of the duty cycle, the voltage, and the current as the heater adjustment decreases. Alternatively, the heater control module 404 can decrease at least one of the duty cycle, the voltage, and the current as the heater adjustment increases and increase at least one of the duty cycle, the voltage, and the current as the heater adjustment decreases.

The adjustment module 408 determines the heater adjustment based on a difference between the pressure measured by the pressure sensor 220 and the pressure setpoint. For example only, the adjustment module 408 can set the heater adjustment based on the measured pressure minus the pressure setpoint. Alternatively, the adjustment module 408 can set the heater adjustment based on the pressure setpoint minus the measured pressure.

The adjustment module 408 determines the heater adjustment using closed loop (CL) control to adjust the difference toward or to zero. For example, the adjustment module 408 can increase the heater adjustment when the measured pressure is less than the pressure setpoint and decrease the heater adjustment when the measured pressure is greater than the pressure setpoint. Examples of closed loop control include proportional integral derivative (PIO) control, a proportional integral (PI) control, an integral (I) control, and other types of CL control.

In various implementations, the adjustment module 408 can set the heater adjustment equal to the difference between the measured pressure and the pressure setpoint. The heater control module 404 can control the application of power to the heater 212 using ON/OFF control. ON/OFF control can include the heater control module 404 applying power to the heater 212 when the measured pressure is less than the pressure setpoint (e.g., as indicated by the heater adjustment). The heater control module 404 can continue to apply power to the heater 212 until the measured pressure is equal to the pressure setpoint or the pressure setpoint plus a first predetermined hysteresis amount. The heater control module 404 can stop applying power to the heater 212 when the measured pressure has become greater than or equal to the pressure setpoint or the pressure setpoint plus the first predetermined hysteresis amount. The heater control module 404 can continue to not apply power until the measured pressure becomes less than the pressure setpoint or the pressure setpoint minus a second predetermined hysteresis amount. The heater control module 404 can begin applying power to the heater 212 when the measured pressure is less than or equal to the pressure setpoint or the pressure setpoint minus the second predetermined hysteresis amount. The heater control module 404 can continue to apply power until the measured pressure becomes greater than or equal to the pressure setpoint or the pressure setpoint plus the first predetermined hysteresis amount, as discussed above. This can maintain the measured pressure at approximately the pressure setpoint or within a range around the pressure setpoint defined by the first and second predetermined hysteresis amounts.

Figure 5:
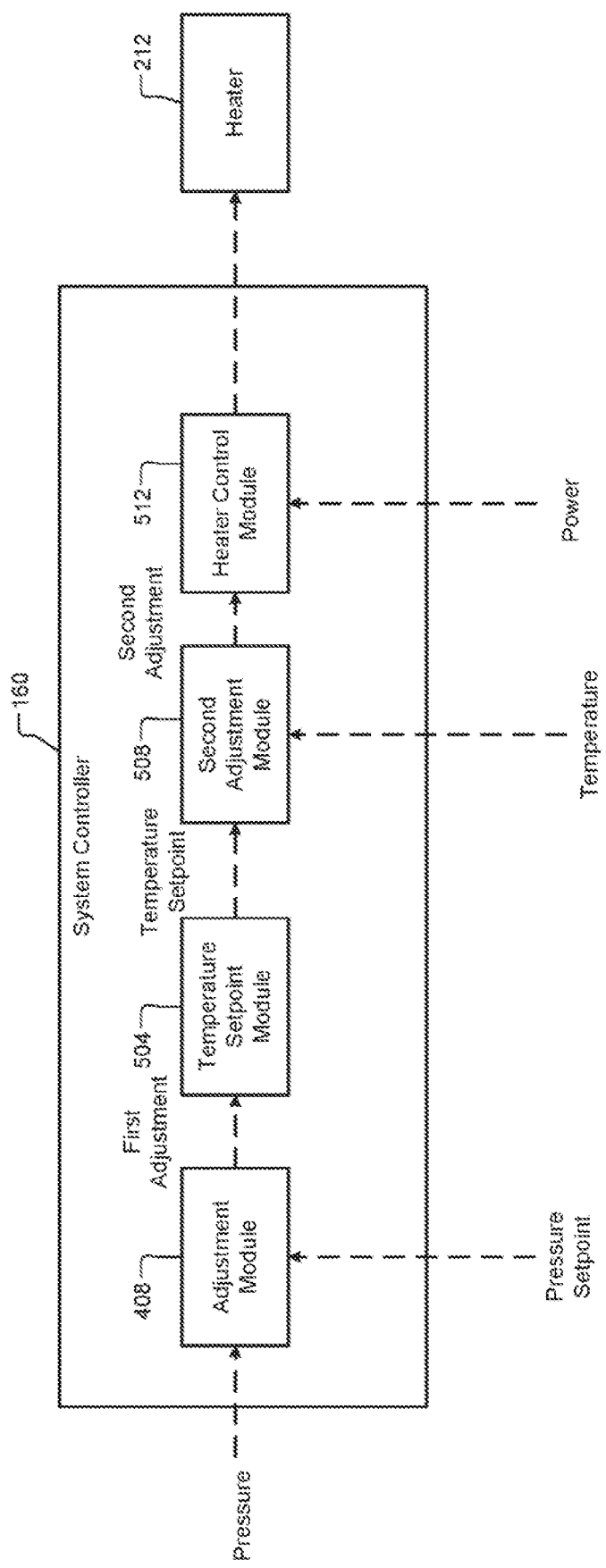

FIG. 5 is a functional block diagram of an example implementation of the system controller 160. The adjustment module 408 determines the heater adjustment (first adjustment) as discussed above. In the example of FIG. 5, a temperature setpoint module 504 selectively adjusts (increases or decreases) a temperature setpoint (relative to a present value) based on the heater adjustment. The temperature setpoint is a setpoint for the temperature measured by the temperature sensor 224. For example, the temperature setpoint module 504 can increase the temperature setpoint as the first adjustment increases. The temperature setpoint module 504 can decrease the temperature setpoint as the first adjustment decreases. Alternatively, the temperature setpoint module 504 can decrease the temperature setpoint as the first adjustment increases and increase the temperature setpoint as the first adjustment decreases.

A second adjustment module 508 determines a second (heater) adjustment based on a difference between the temperature measured by the temperature sensor 224 and the temperature setpoint. For example only, the second adjustment module 508 can set the second adjustment based on the measured temperature minus the temperature setpoint. Alternatively, the second adjustment module 508 can set the second adjustment based on the temperature setpoint minus the measured temperature.

The second adjustment module 508 determines the second adjustment using closed loop (CL) control to minimize the difference. In other words, the second adjustment module 508 determines the second adjustment using closed loop control to adjust the difference toward zero. For example, the second adjustment module 508 can increase the second adjustment when the measured temperature is less than the temperature setpoint and decrease the second adjustment when the temperature is greater than the temperature setpoint. Examples of closed loop control include proportional integral derivative (PIO) control, a proportional integral (PI) control, an integral (I) control, and other types of CL control.

In various implementations, the second adjustment module 508 can set the second adjustment equal to the difference between the temperature and the temperature setpoint.

A heater control module 512 receives power, such as DC power from the power source. The heater control module 512 controls application of electrical power to the heater 212. For example, the heater control module 512 can control a duty cycle of power applied to the heater 212. While the example of PWM control is provided, the present application is also applicable to other types of control. For example, the heater control module 512 can control at least one of (a) a voltage applied to the heater 212 and (b) current through the heater 212.

The heater control module 512 selectively adjusts (increases or decreases) power applied to the heater 212 based on the second adjustment. The heater control module 512 can, for example, based on the second adjustment, adjust at least one of the duty cycle, the voltage applied to the heater 212, and the current through the heater 212. For example, the heater control module 512 can increase at least one of the duty cycle (relative to a present duty cycle), the voltage (relative to a present voltage), and the current (relative to a present current) as the second adjustment increases. The heater control module 404 can decrease at least one of the duty cycle, the voltage, and the current as the second adjustment decreases. Alternatively, the heater control module 512 can decrease at least one of the duty cycle, the voltage, and the current as the second adjustment increases and increase at least one of the duty cycle, the voltage, and the current as the second adjustment decreases.

Figure 6:
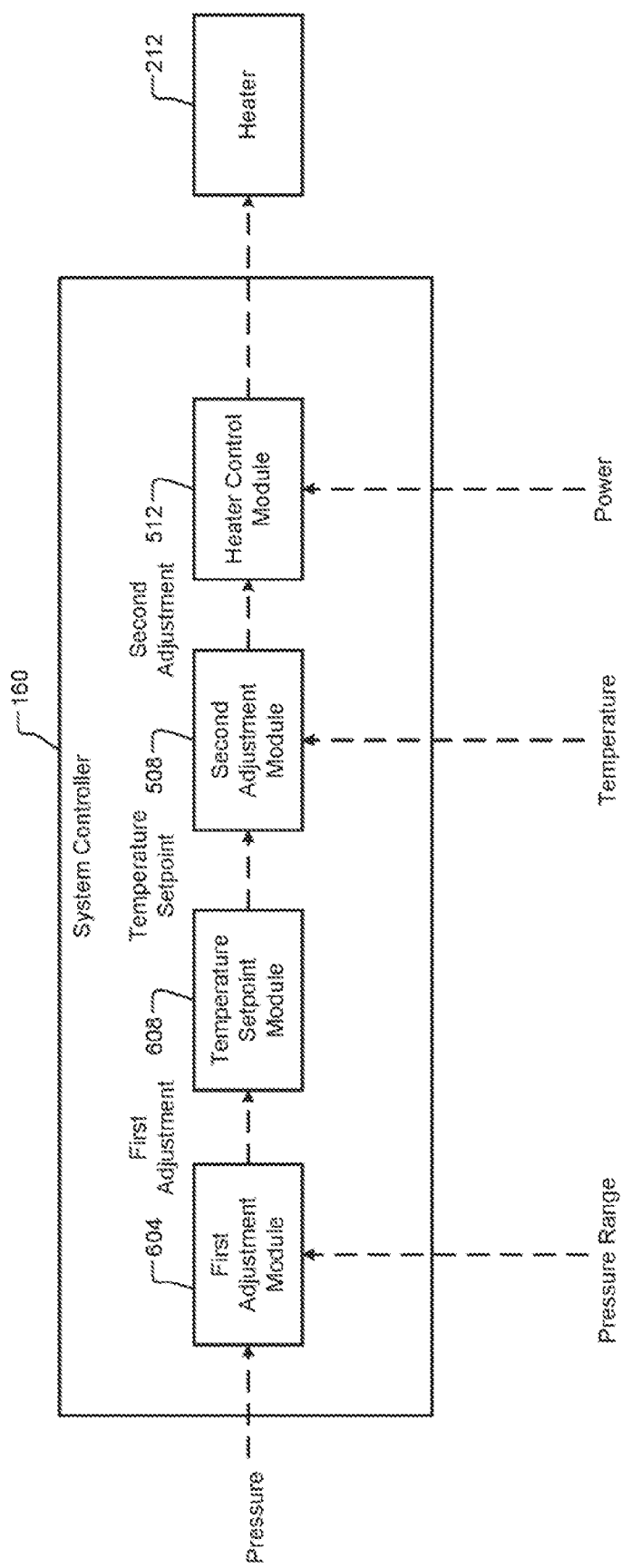

FIG. 6 is a functional block diagram of an example implementation of the system controller 160. A first adjustment module 604 determines a first (heater) adjustment based on a comparison of the pressure measured by the pressure sensor 220 and a predetermined pressure range. The predetermined pressure range is bounded by a first predetermined pressure and a second predetermined pressure that is less than the first predetermined pressure.

The first adjustment module 604 leaves the first adjustment unchanged (i.e., maintains the first adjustment) when the measured pressure is within the predetermined pressure range between the first and second predetermined pressures. When the measured pressure is greater than the first predetermined pressure, the first adjustment module 604 can decrease the first adjustment. The first adjustment module 604 can, for example, decrease the first adjustment by a predetermined decrement amount each predetermined period while the measured pressure is greater than the first predetermined pressure. When the measured pressure is less than the second predetermined pressure, the first adjustment module 604 can increase the second adjustment. The first adjustment module 604 can, for example, increase the first adjustment by a predetermined increment amount each predetermined period while the measured pressure is less than the second predetermined pressure.

A temperature setpoint module 608 selectively adjusts (increases or decreases) a temperature setpoint (relative to a present value) based on the first adjustment. For example, the temperature setpoint module 608 can increase the temperature setpoint when the first adjustment increases and decrease the temperature setpoint when the first adjustment decreases. Alternatively, the temperature setpoint module 608 can decrease the temperature setpoint as the first adjustment increases and increase the temperature setpoint as the first adjustment decreases. The temperature setpoint module 608 can increment and decrement the temperature setpoint by predetermined increment and decrement amounts in various implementations.

The second adjustment module 508 determines the second adjustment based on a difference between the temperature measured by the temperature sensor 224 and the temperature setpoint, as discussed above. The heater control module 512 selectively adjusts (increases or decreases) power applied to the heater 212 based on the second adjustment, as discussed above.

Figure 7:
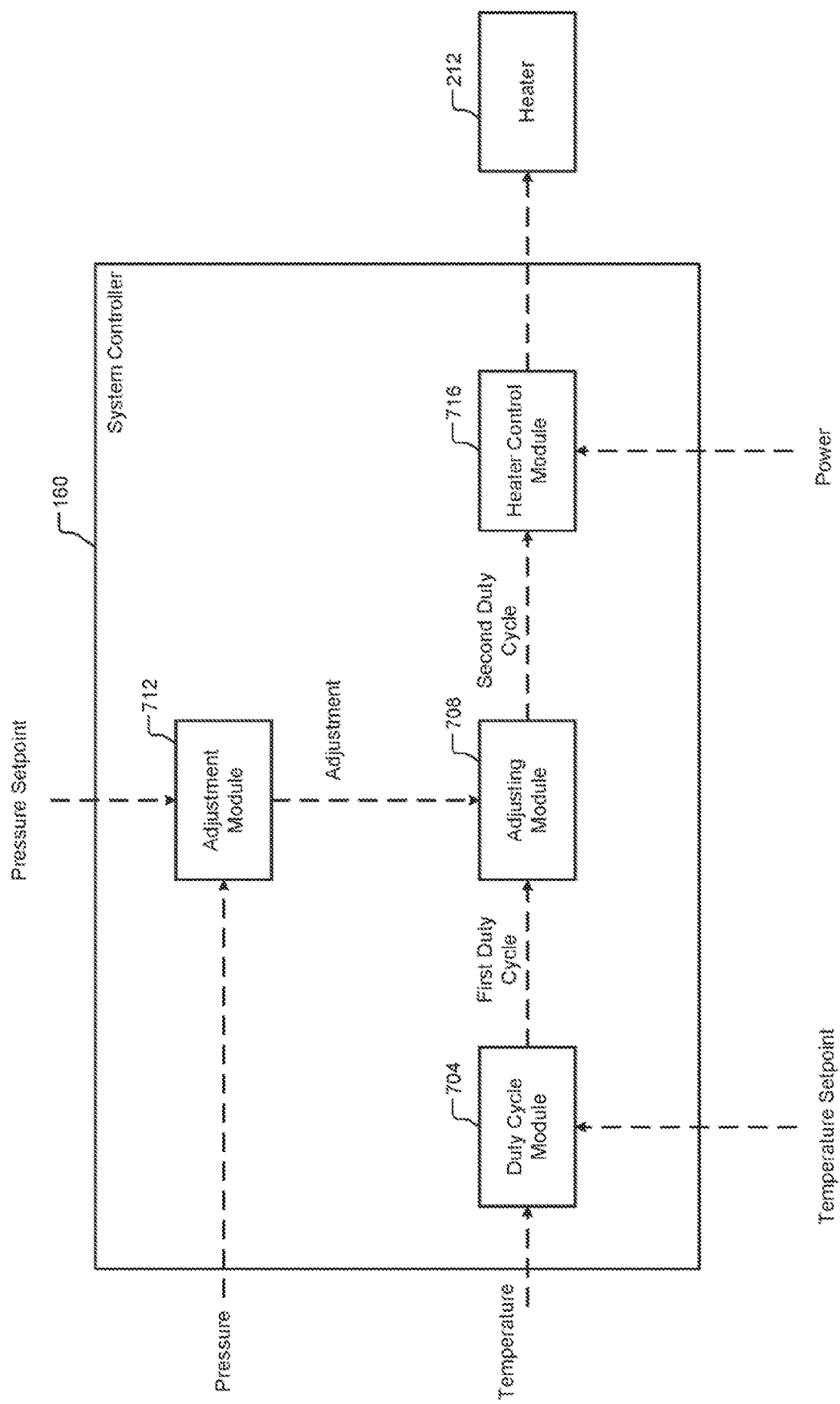

FIG. 7 is a functional block diagram of an example implementation of the system controller 160. A duty cycle module 704 determines a first duty cycle based on a difference between the temperature measured by the temperature sensor 224 and the temperature setpoint. The duty cycle module 704 can set the first duty cycle based on a difference between the measured temperature and the temperature setpoint. The duty cycle module 704 can determine the first duty cycle, for example, using an equation or a lookup table that relates differences to first duty cycles. The duty cycle module 704 can, for example, decrease the first duty cycle when the measured temperature is greater than the temperature setpoint and increase the first duty cycle when the measured temperature is less than the temperature setpoint.

An adjusting module 708 determines a second duty cycle by adjusting the first duty cycle based on an adjustment. For example the adjusting module 708 can set the second duty cycle based on or equal to (a) the first duty cycle plus the adjustment, (b) the first duty cycle minus the adjustment, or (c) the first duty cycle multiplied by the adjustment.

An adjustment module 712 determines the adjustment based on a difference between the pressure measured by the pressure sensor 220 and the pressure setpoint. The adjustment module 712 can determine the adjustment, for example, using an equation or a lookup table that relates differences (between the pressure and the pressure setpoint) to adjustments. The duty cycle module 704 can, for example, decrease the adjustment when the measured pressure is greater than the pressure setpoint and increase the adjustment when the measured pressure is less than the pressure setpoint.

A heater control module 716 receives power, such as DC power, from the power source. The heater control module 716 applies power to the heater 212 based on or at the second duty cycle.

The examples above provide close loop control involving adjusting at least one of the temperature setpoint, the pressure setpoint, and power applied to the heater 212 to achieve stable pressure input to the MFC 216. In various implementations, ON/OFF control can be used. In various implementations, such as in the example of FIG. 7, parallel closed loops can be used to increase or decrease the power applied to the heater 212 based on both the measured temperature and the measured pressure.

Figure 8:
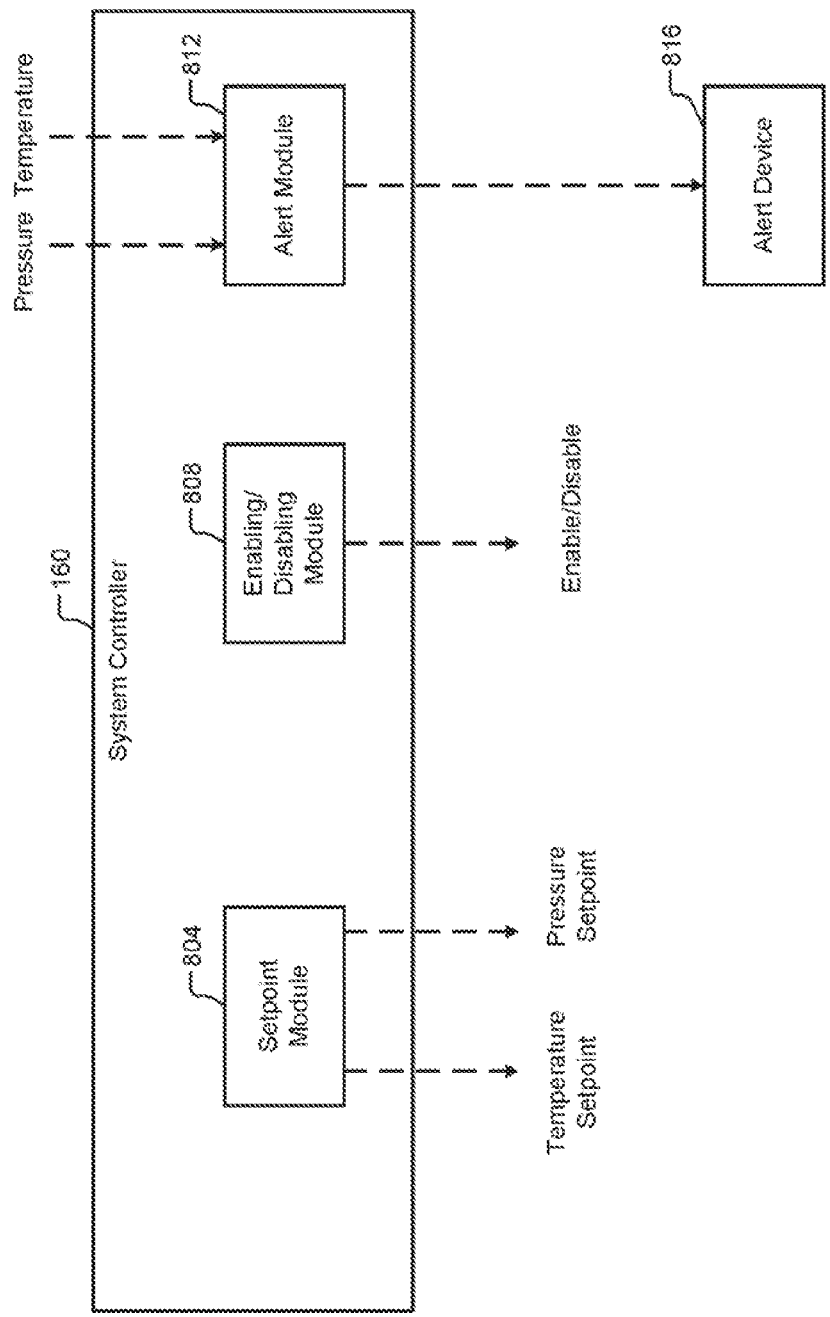

FIG. 8 is a functional block diagram of example components of the system controller 160. A setpoint module 804 can set or initialize at least one of the temperature setpoint and the pressure setpoint. For example, the setpoint module 804 can initialize the temperature setpoint to a predetermined temperature at startup of the ampoule 204. After initialization, the temperature setpoint can be selectively adjusted as described above to control the pressure input to the MFC 216.

In various implementations, the heater control module can limit the power applied to the heater 212 when the pressure measured by the temperature sensor 220 is outside of a predetermined pressure range. The predetermined pressure range can be set based on user input in various implementations. Additionally, when the pressure is outside of the predetermined pressure range, the setpoint module 804 can set the temperature setpoint to a predetermined out of range temperature. The predetermined temperature range can be set based on user input.

An enabling/disabling module 808 can disable closed loop control based on the pressure and the pressure setpoint (e.g., the adjustment module 408, the first adjustment module 604, the adjustment module 712) when the measured pressure is outside of the predetermined pressure range. This can minimize a possibility of over temperature events, under temperature events, over pressure events, and under pressure events. The enabling/disabling module 808 can re-enable closed loop control based on the pressure and the pressure setpoint when the measured pressure is within the predetermined pressure range. The enabling/disabling module 808 can also require that the temperature measured by the temperature sensor 224 be less than a predetermined upper temperature before re-enabling closed loop control. When re-enabling, the setpoint temperature and the setpoint pressure when the disabling occurred can be used.

An alert module 812 can selectively generate an alert via an alert device 816 to change the ampoule 204 (and the solid precursor material). The alert module 812 can generate the alert, for example, when the temperature measured by the temperature sensor 224 is greater than or equal to a predetermined maximum temperature. Additionally or alternatively, the alert module 812 can generate the alert when the pressure measured by the pressure sensor 220 is less than a predetermined minimum temperature to deliver a proper amount of gaseous precursor to the MFC 216 from the ampoule 204. The alert module 812 can, for example, display a predetermined message on a display, illuminate an indicator, and/or take one or more other actions to alert users to change the ampoule 204. While the example of visual alerts is provided, the alert module 812 can additionally or alternatively generate at least one of an audible alert via one or more speakers and a haptic alert via one or more haptic devices.

In view of the above, the ampoule 204 can be located remotely from the MFC 216 and not integrated with the processing chamber 104. For example, the ampoule 204 can be located at a subfab or on a manufacturing floor near the processing chamber 104. In various implementations, the ampoule 204 can be integrated into the processing chamber 104.

Figure 9:
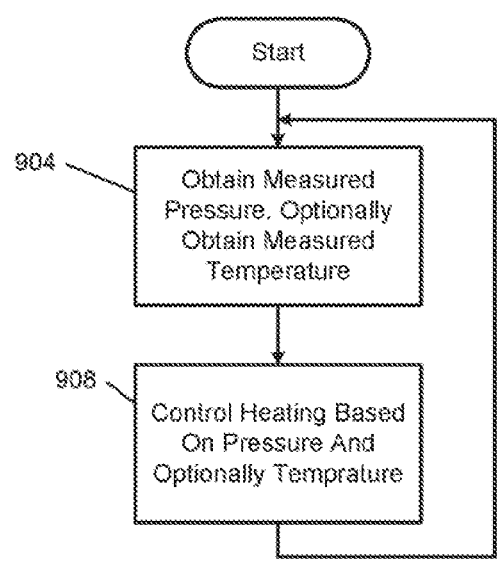
FIG. 9 is a flowchart depicting controlling heating of an ampoule based on pressure measured downstream of the ampoule.

FIG. 9 is a flowchart depicting an example method of controlling pressure of gaseous precursor input to the MFC 216. Control begins with 904, where the pressure sensor 220 measures the pressure of gaseous precursor input to the MFC 216 from the ampoule 204. The temperature sensor 224 can also measure the temperature of the ampoule 204 at 904.

At 908, the heater control module (e.g., 404, 512, 716) controls the power applied to the heater 212 based on the measured pressure using closed loop control, as described above in the examples of FIGS. 4-8. The heater control module can control the power applied to the heater 212 additionally based on the measured temperature measured by the temperature sensor 224, as described above in the examples of FIGS. 4-8.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method can be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which can be part of the above-described examples. Such systems can include semiconductor processing equipment, including a processing tool or tools, chamber or chambers, a platform or platforms for processing, and/or specific processing components (a wafer pedestal, a gas flow system, etc.). These systems can be integrated with electronics for controlling their operation before, during, and after processing of a semiconductor wafer or substrate. The electronics can be referred to as the "controller," which can control various components or subparts of the system or systems. The controller, depending on the processing requirements and/or the type of system, can be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller can be defined as electronics having various integrated circuits, logic, memory, and/or software that receive instructions, issue instructions, control operation, enable cleaning operations, enable endpoint measurements, and the like. The integrated circuits can include chips in the form of firmware that store program instructions, digital signal processors (DSPs), chips defined as application specific integrated circuits (ASICs), and/or one or more microprocessors, or microcontrollers that execute program instructions (e.g., software). Program instructions can be instructions communicated to the controller in the form of various individual settings (or program files), defining operational parameters for carrying out a particular process on or for a semiconductor wafer or to a system. The operational parameters can, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, can be a part of or coupled to a computer that is integrated with the system, coupled to the system, otherwise networked to the system, or a combination thereof. For example, the controller can be in the "cloud" or all or a part of a fab host computer system, which can allow for remote access of the wafer processing. The computer can enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which can include a local network or the Internet. The remote computer can include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters can be specific to the type of process to be performed and the type of tool that the controller is configured to interface with or control. Thus as described above, the controller can be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems can include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALO) chamber or module, an atomic layer etch (ALE) chamber or module, an ion implantation chamber or module, a track chamber or module, and any other semiconductor processing systems that can be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system to control gas flow, the system comprising:
an ampoule to store a solid precursor material;
a heater to heat the ampoule and to sublimate the solid precursor material into a gaseous precursor;
a mass flow controller to regulate a flow of the gaseous precursor from the ampoule to a processing chamber;
a pressure sensor to measure a pressure of the gaseous precursor input to the mass flow controller; and
a controller configured to apply power to the heater using closed loop control based on the pressure of the gaseous precursor input to the mass flow controller and a pressure setpoint for the pressure of the gaseous precursor input to the mass flow controller.

2. The system of claim 1 wherein the controller is configured to increase power to the heater when the pressure is less than the pressure setpoint and to decrease power to the heater when the pressure is greater than the pressure setpoint.

3. The system of claim 1 wherein the solid precursor material is one of molybdenum and tungsten.

4. The system of claim 1 wherein the controller is configured to vary a duty cycle of power applied to the heater based on the pressure and the pressure setpoint.

5. The system of claim 1 wherein the controller is configured to vary at least one of (a) and (b) based on the pressure and the pressure setpoint,
wherein (a) comprises a voltage applied to the heater and (b) comprises a current through the heater.

6. The system of claim 1 wherein the closed loop control comprises proportional integral control.

7. The system of claim 1 wherein the controller is configured to determine an adjustment based on a difference between the pressure and the pressure setpoint and to selectively adjust the power applied to the heater based on the adjustment.

8. The system of claim 1 further comprising a temperature sensor to measure a temperature of the ampoule,
wherein the controller is configured to apply power to the heater further based on the temperature of the ampoule and a temperature setpoint.

9. The system of claim 8 wherein the controller is configured to:
determine a first adjustment based on a first difference between the pressure and the pressure setpoint;
selectively adjust the temperature setpoint based on the first adjustment; determine a second adjustment based on a second difference between the temperature of the ampoule and the temperature setpoint; and
selectively adjust the power applied to the heater based on the second adjustment.

10. The system of claim 8 wherein the controller is configured to:
determine a first duty cycle based on a first difference between the temperature of the ampoule and the temperature setpoint;
determine an adjustment based on a second difference between the pressure and the pressure setpoint;
determine a second duty cycle based on the first duty cycle and the adjustment; and
apply power to the heater at the second duty cycle.

11. The system of claim 1 wherein the controller is configured to disable the closed loop control when the pressure is one of: less than a first predetermined pressure and greater than a second predetermined pressure that is greater than the first predetermined pressure.

12. The system of claim 1 wherein the controller is configured to generate an alert when the pressure is less than a predetermined pressure.

13. The system of claim 1 wherein the controller is configured to generate an alert when a temperature of the ampoule measured by a temperature sensor is greater than or equal to a predetermined temperature.

14. The system of claim 1 wherein the pressure sensor is disposed between the ampoule and the mass flow controller.

15. The system of claim 1 wherein the mass flow controller comprises the pressure sensor.

16. A method of controlling gas flow, the method comprising:
storing a solid precursor material in an ampoule;
by a heater, heating the ampoule and sublimating the solid precursor material into a gaseous precursor;
by a mass flow controller, regulating a flow of the gaseous precursor from the ampoule to a substrate processing chamber;
by a pressure sensor, measuring a pressure of the gaseous precursor input to the mass flow controller; and
applying power to the heater using closed loop control based on the pressure of the gaseous precursor input to the mass flow controller and a pressure setpoint for the gaseous precursor input to the mass flow controller.

17. The method of claim 16 wherein the applying power comprises increasing power to the heater when the pressure is less than the pressure setpoint and decreasing power to the heater when the pressure is greater than the pressure setpoint.

18. The method of claim 16 wherein the applying power comprises varying a duty cycle of power applied to the heater based on the pressure and the pressure setpoint.

19. The method of claim 16 wherein the applying power comprises, based on the pressure and the pressure setpoint, varying at least one of (a) a voltage applied to the heater and (b) a current through the heater.

20. A system to control gas flow, the system comprising:
an ampoule to store a solid precursor material;
a heater to heat the ampoule and to sublimate the solid precursor material into a gaseous precursor; and
a controller configured to apply power to the heater using closed loop control based on (a) a pressure of the gaseous precursor input to a mass flow controller and (b) a pressure setpoint for the gaseous precursor input to the mass flow controller.

* * * * *